(12) United States Patent
Yanagisawa

(10) Patent No.: US 8,679,392 B2
(45) Date of Patent: Mar. 25, 2014

(54) PROCESS TO FORM A MOLD OF NANOIMPRINT TECHNIQUE FOR MAKING DIFFRACTION GRATING FOR DFB-LD

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 170 days.

(21) Appl. No.: 13/105,494

(22) Filed: May 11, 2011

(65) Prior Publication Data

US 2011/0212556 A1 Sep. 1, 2011

Related U.S. Application Data

(63) Continuation of application No. 12/222,671, filed on Aug. 13, 2008, now abandoned.

(30) Foreign Application Priority Data

Aug. 23, 2007 (JP) ................................. 2007-217512

(51) Int. Cl.
*B28B 11/08* (2006.01)

(52) U.S. Cl.
USPC ................. 264/293; 438/32; 216/11; 216/79; 977/887; 977/888

(58) Field of Classification Search
USPC ......... 264/293; 438/32; 216/11, 79; 977/887, 977/888

See application file for complete search history.

(56) References Cited

U.S. PATENT DOCUMENTS

| 7,165,957 B2 | 1/2007 | Montelius et al. |
| 7,629,596 B2 * | 12/2009 | Taniguchi ................... 250/492.2 |
| 2007/0164458 A1 * | 7/2007 | Ogino et al. ................... 257/797 |

OTHER PUBLICATIONS

Stephen Y. Chou, et al., "Nanoimprint lithography", J. Vac. Sci. Technol. B 14(6), Nov./Dec. 1996, pp. 4129-4133.

* cited by examiner

*Primary Examiner* — Joseph S Del Sole
*Assistant Examiner* — David N Brown, II
(74) *Attorney, Agent, or Firm* — Smith, Gambrell & Russell, LLP.

(57) ABSTRACT

A process using the nanoimprint technique to form the diffraction grating for the DFB-LD is disclosed. The process includes (a) coating a resist for the EB exposure on a dummy substrate, (b) irradiating the resist as varying the acceleration voltage, (c) forming a resist pattern by developing the irradiated resist, (d) coating the SOG film on the patterned resist, (e) attaching the silica substrate on the cured SOG film, and (f) removing the dummy substrate with the resist from the SOG film and the silica substrate. Using the mold thus formed, the diffraction grating for the DFB-LD is formed by the nanoimprint technique.

2 Claims, 10 Drawing Sheets

US 8,679,392 B2

PROCESS TO FORM A MOLD OF NANOIMPRINT TECHNIQUE FOR MAKING DIFFRACTION GRATING FOR DFB-LD

CROSS REFERENCE TO RELATED APPLICATION

This application is a continuation of Ser. No. 12/222,671 filed Aug. 13, 2008, which is being incorporated in its entirety herein by reference.

BACKGROUND OF THE INVENTION

1. Field of the Invention

The present invention related to a process to form a mold, for the nanoimprint technique, the mold having a pattern for the diffraction grating, a process to form the diffraction grating and a process to form the distributed feedback laser diode (hereafter denoted as DFB-LD) with the diffraction grating.

2. Related Prior Art

Conventionally, the diffraction grating for the DFB-LD has been formed by, after preparing the resist pattern by the interference lithography or the electron beam lithography (EB lithography), etching the semiconductor material with resist pattern as the etching mask. Recently, another technique to form the diffraction grating has been known in which a mold having the grating pattern is pressed against a resin to transfer the grating pattern on this resin, which is often called as the nanoimprint technique. Prior documents, such as the U.S. Pat. No. 7,165,957, and Journal of Vacuum Science and Technology, vol. B14 (6), pp. 4129-4133 (1996), have disclosed the nanoimprint technique.

Because the interference lithography, or the EB lithography, is inevitable to form the patterns with an uniform depth, that is, the aspect ratio of the obtained patterns is uniform within a wafer; accordingly, it is quite hard to modify the depth of the diffraction grating in a limited portion thereof or to control the depth of the resist patterns intentionally so as to compensate the inhomogeneous etching rate within the wafer. Moreover, it is further difficult to grade the duty ratio of the patterns optionally within the wafer. Here, the duty ratio of the pattern means the ratio of the width of the rib against the width of the valley of the pattern. It is also hard or at least necessary for a long time to distribute the pitch of the patterns optionally in the wafer. Thus, the conventional technique of the interference lithography fundamentally limits to the uniform resist patterns within the wafer. That is, only one type of the patterns may be realized in the single wafer by the conventional technique.

SUMMARY OF THE INVENTION

An aspect of the present invention relates to a process to form a mold for the nanoimprint technique. This mold is used to form the diffract ion grating for the DFB-LD. The process includes: (a) coating a dummy substrate with a photo resist for the electron beam lithography; (b) irradiating the photo resist by electron beams as varying the acceleration voltage of the electron beams; (c) developing the irradiated resist to form a resist pattern; (d) coating this resist pattern with a mold resin, which is to be converted into the mold; (e) curing the mold resin; and (f) removing the dummy substrate and the resist pattern from the cured mold resin. The mold resin may be a spin on glass (SOG).

Because the irradiation of the electron beams are carried out as varying its acceleration voltage, the resultant resist pattern shows a non-uniform dimensions. For instance, the depth (or the height), the duty ratio, the aspect ratio, the pitch and so on of the pattern are varied within the dummy substrate. Accordingly, the diffraction grating obtained by using thus prepared mold shows the non-uniform characteristic.

Another process to form the mold according to the present invention includes: (a) coating a substrate with a first photo resist; (b) irradiating a first limited region of this first photo resist by the electron beams; (c) developing the irradiated first photo resist to prepare a first resist pattern; (d) etching the substrate under a first condition with the patterned first photo resist as the etching mask to form a first pattern on the substrate and removing the patterned first photo resist after the etching; (e) coating the substrate with a second photo resist for the electron beam lithography; (f) irradiating a second limited region, different from the first limited region, of the second photo resist by the electron beams; (g) developing the irradiated second photo resist to prepare a second resist pattern; and (h) etching the substrate under a second condition different from the first condition with the patterned second photo resist as the etching mask to form a second pattern on the substrate and removing the patterned second photo resist after the etching. The first pattern and the second pattern each formed in the substrate constitute at least a portion of patterns provided in the mold.

Still another process to form the mold according to the present invention includes: (a) coating a substrate with a photosensitive film; (b) irradiating the photosensitive film by electron beams as varying the acceleration voltage of the electron beams; and (c) developing the irradiated photosensitive film to form a pattern for the diffraction grating. The photosensitive film may be a spin on glass material.

DESCRIPTION OF PREFERRED EMBODIMENTS

Figure 1A:
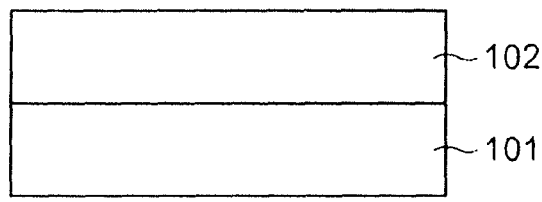
FIGS. 1A to 1C schematically illustrate the first process to form the mold according to the invention.

Next, preferred embodiments according to the present invention will be described as referring to accompanying drawings. In the description of the drawings, the same elements will be referred by the same numerals or the same symbols without overlapping explanations. Further, dimensions illustrated in the drawings do not always reflect the practical one or that of the descriptions. First, a method to prepare the mold will be described.

(First Method to Prepare the Mold)

Figure 2A:
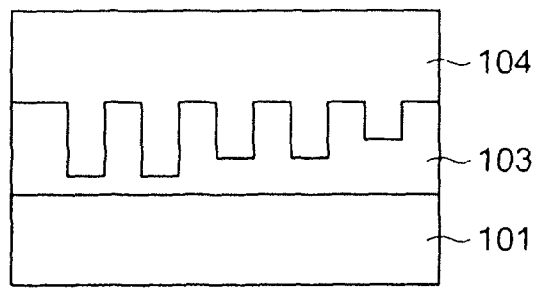
FIGS. 2A to 2C schematically illustrate the first process performed subsequent to FIG. 1C.
Figure 2B:
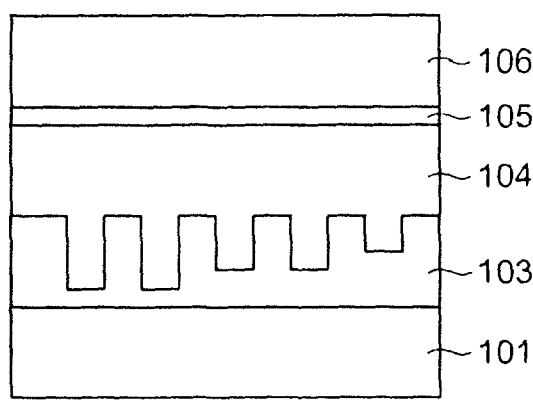
Figure 2C:
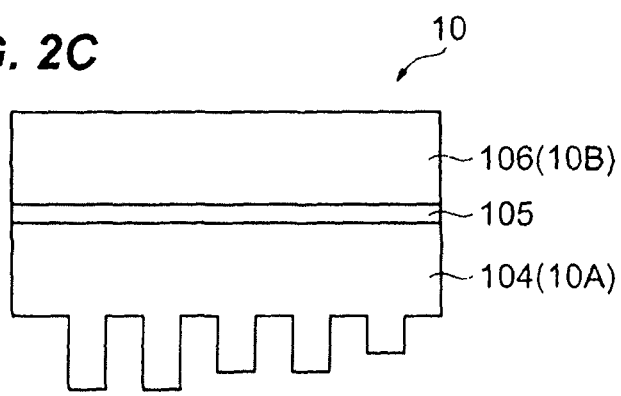

FIGS. 1A and 2C illustrate a process to prepare the mold 10 according to the first method. As illustrated in FIG. 1A, the process coats a photo resist 102 for the electron beam (hereafter denoted as EB) lithography on the dummy substrate 101, typically a silicon substrate. The photo resist 102 may be a positive type photo resist such as ZEP-520 provided from Zeon Corp.

Figure 1B:
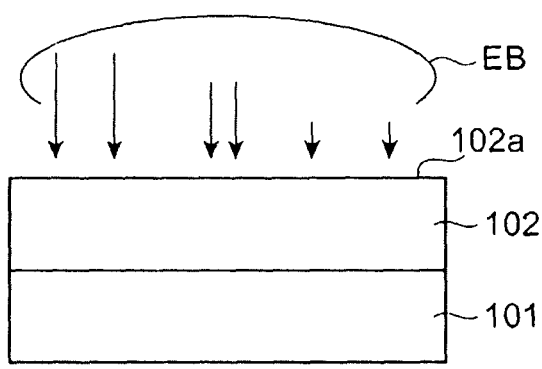

Next, the electron beam EB irradiates on the surface 102a of the photo resist 102 as varying the acceleration voltage, the exposure dose, and the scanning patterns thereof (FIG. 1B). In FIG. 1B, the length of the arrowhead corresponds to the acceleration voltage, while, the spans between the arrowheads denotes the scanning width of the electron beams.

Figure 1C:
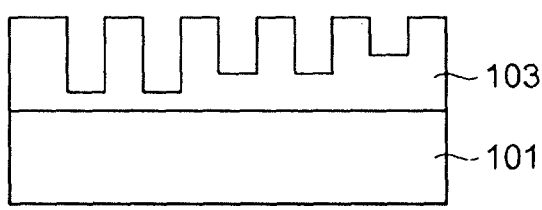

Developing the photo resist 102, we can obtain the resist patterns 103 as illustrated in FIG. 1C. Because the irradiation of the electron beam is carried out as varying the acceleration voltage, the exposure dose and the scanning patterns, which varies the irradiation depth and area of the electron beam, the resultant patterns obtained in the photo resist 103 varies its depth, an aspect ratio, a pattern pitch, and so on.

Next, the process coats the spin-on-glass (hereafter denoted as SOG) film 104 on the patterned photo resist 103, as illustrated in FIG. 2A. This SOG film 104 will be converted to the pattern 10A of the mold 10, which will be described later.

Next, the silica substrate 106 is attached to the SOG film 104 with an adhesive 105 after the SOG film 104 is cured (FIG. 2B). This silica substrate 106 will be the substrate 10B of the mold 10. Subsequently, the dummy substrate 101 and the patterned resist 103 are removed; thus, the mold with the pattern 10A of the SOG film 104 on the silica substrate 10B is completed as illustrated in FIG. 2C.

Figure 3:
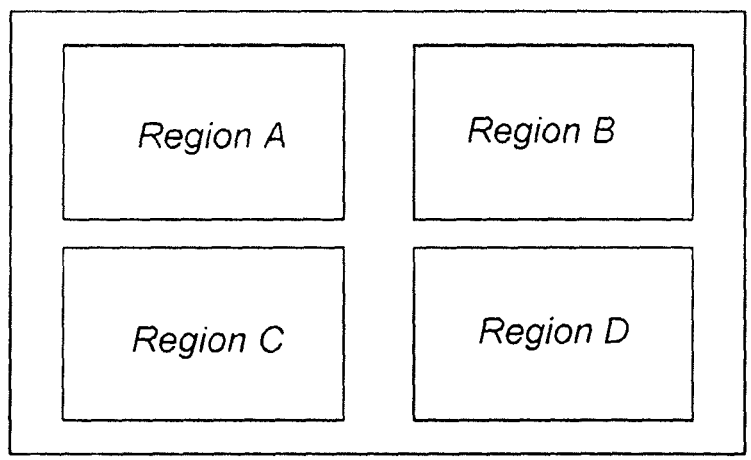
FIG. 3 images a mold viewed from a side where the patterns are formed.

FIG. 3 shows the mold 10 viewed from the side where the pattern 10A is formed. The mold 10 provides a plurality of regions each having particular patterns specific to the region, for example, patterns in the regions, A to D, provide particular aspect ratio of 1.0 to 2.5 with a step of 0.5, respectively. When the irradiation of the electron beams is carried out as varying its acceleration voltage, the depths (or the height) and the duty ratios of patterns in each region, A to D, are different from each other. Or, when the irradiation is carried out as varying the pitch of the patterns, the pitch of the patterns in respective sections, A to D, shows the different pitch. Here, the aspect ratio means a ratio of the pattern width to the depth, the duty ratio means a ratio of the pattern width to the pattern span, and the pitch means the distance from one pattern in the top thereof to the next pattern also in the top thereof.

According to the process thus described, the patterns 10A formed on the mold 10 varies their depth, the duty ratio, the pitch and so on reflecting the acceleration voltage of the electron beams, the exposure dose and the scanning patterns. Accordingly, using this mold 10 with various patterns of the depth, the duty ratio, the pitch and so on for forming the diffraction grating for the DFB-LD, diffraction gratings with various configurations may be obtained within a semiconductor wafer.

(Second Method to Form Mold)

FIGS. 4A to 5C show a process to form a mold 11 according to one embodiment of the invention.

Figure 4A:
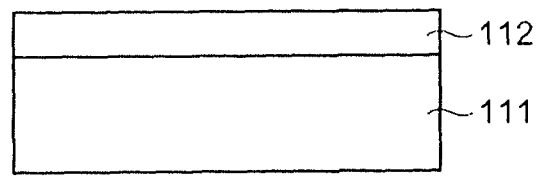
FIGS. 4A to 4D schematically illustrate the second process to form the mold according to the invention.
Figure 4B:
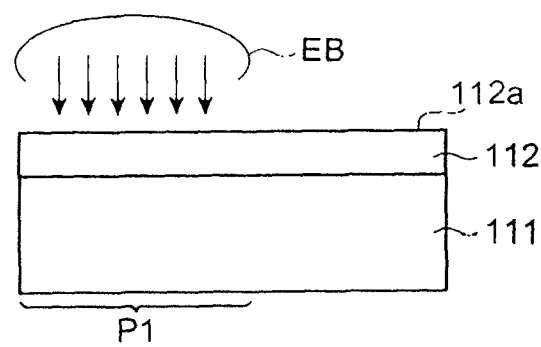

First, the process coats a photo resist 112 for the electron beam lithography on the substrate 111, typically a silicon substrate, as illustrated in FIG. 4A. The photo resist 112 may be a positive type photo resist such as ZEP-520 provided from Zeon Corp.

Figure 4C:
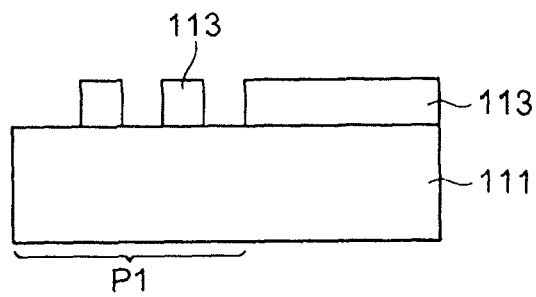
Figure 4D:
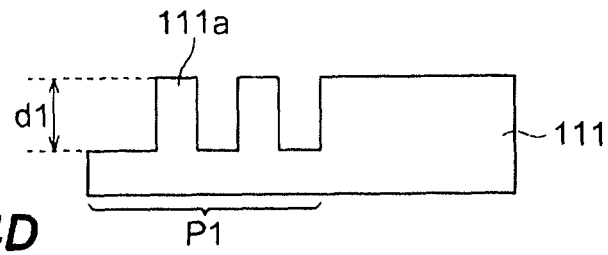

Next, the electron beam EB irradiates on the surface 112a of the photo resist 112. In this process, the acceleration voltage and the exposure dose of the electron beam may be varied as those of the first embodiment described above. Further, the process may irradiate the electron beam such that the scanning patterns or the pitch thereof has a predetermined distribution. Developing the irradiated resist 112, we obtain the first resist pattern 113 as shown in FIG. 4C.

Carrying out the first etching of the substrate 111 using the first resist pattern 113 as the etching mask and subsequently removing the resist 112, a first pattern 111a may be obtained with the depth of d1 on the substrate 111. The portion except for the region P1 leaves no patterns because it is covered with the resist 112.

Figure 5A:
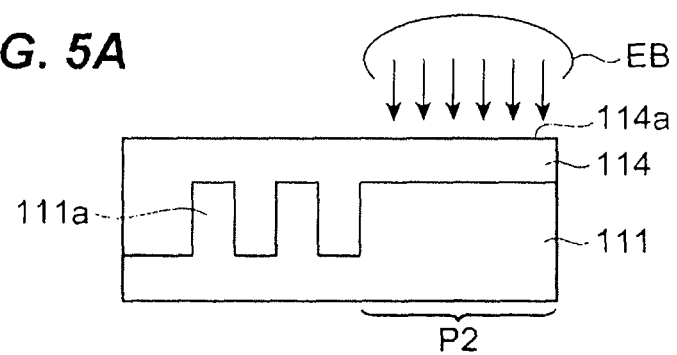
FIGS. 5A to 5C schematically illustrate the second process performed subsequent to FIG. 4D.

Next, the process coats the second resist 114 on the substrate 111 with the first pattern 111a again as illustrate in FIG. 5A. This second resist 114 may be the same with the first resist 112. Subsequently, the process irradiates the electron beams on a region P2 except for the first region P1. In this process, the acceleration voltage and the exposure dose of the electron beams may be varied in each irradiation, or the patterns to be irradiated may have a preset distribution in the shape thereof.

Figure 5B:
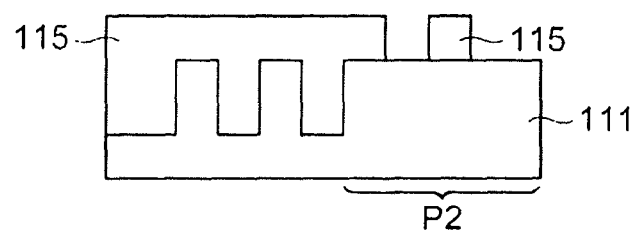

Developing the second resist 114, the second pattern 115 as illustrated in FIG. 5B may be obtained. Etching the substrate 111 with the second resist 115 as the etching mask and removing the second resist 115, the second pattern 111b with a depth of d2 may be obtained. The process conditions of the second etching may be different from those of the first etching. In this process, the region except for the region P2 is covered with second resist 115 and no patterns are left. Iterating the formation of the resist patterns and the etching of the substrate 111 by distinguishable conditions, the mold 11 according to the second method may be obtained.

FIG. 3 shows the mold 11 viewed from the side where the patterns, 111a and 111b, are formed, where each region forms particular patterns specific to the region, for instance, patterns in the region, A to D, provide particular aspect ratio of 1.0 to 2.5 by a step of 0.5, respectively. When the irradiation of the electron beams is carried out as varying its acceleration voltage, the depths (or the height) and the duty ratios of patterns in each section, A to D, are different from each other. Or, when the exposure is carried out as varying the pitch of the scanning patterns, the pitch of the resultant patterns formed in the mold in respective regions, A to D, shows the different pitches.

Figure 5C:
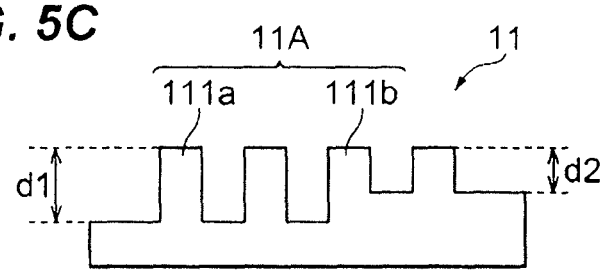

According to the second process described above, the patterns 11A in respective regions provide the depth, d1 or d2 shown in FIG. 5C, specific to the region and different from the other regions. Forming the diffraction grating using this mold 11 with the patterns 11A, the resultant gratings have different characteristics within the wafer.

Moreover, using this mold 11 to form the diffraction grating within the wafer, the process may avoid the iteration of the resist coating, the irradiation on the resist, the developing, and the removal of the resist to form the various gratings, which may protect the wafer from the process damage, such as due to the irradiation of the electron beams and the etching. As described later, the process cost and the term thereof to form the pattern for the diffraction grating by the nanoimprint technique using this mold may be remarkably shortened, and the process damage applied to the semiconductor material may be reduced.

(Third Method to Form Mold)

Figure 6A:
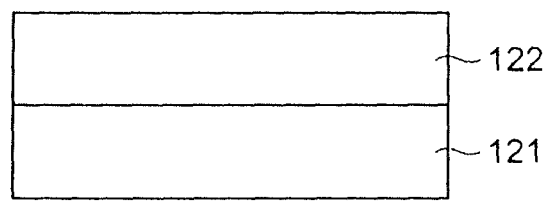
FIGS. 6A to 6C schematically illustrate the third process to form the mold according to the invention.
Figure 6B:
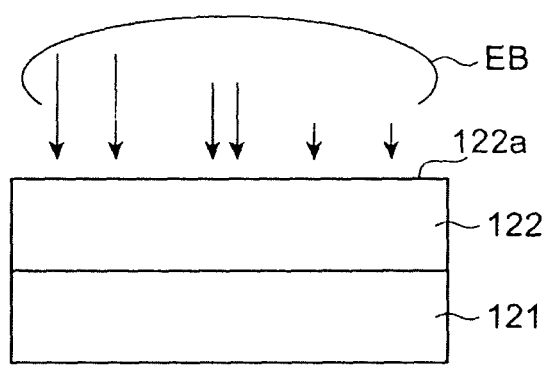
Figure 6C:
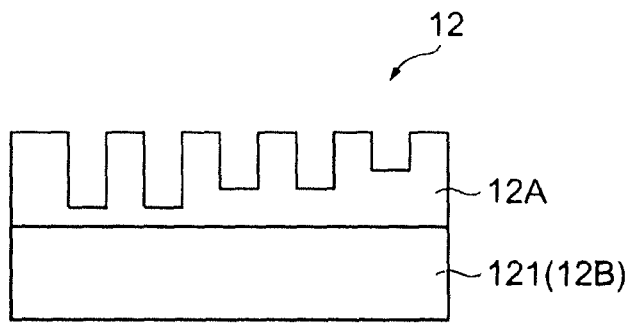

FIGS. 6A to 6C schematically illustrate the process to form the mold 12 according to the third embodiment of the invention. This process first coats the SOG film 122 on the silicon (Si) substrate 121 by the spin coater (FIG. 6A). As described later, the Si substrate 121 becomes the base 12B of the mold 12, while, the SOG 122 converts the pattern 12A of the mold 12.

Next, the process irradiates the electron beams on the surface 122a of the SOG film as varying its acceleration voltage or the exposure dose, or varying the scanning patterns within the substrate, as illustrated in FIG. 6B.

Subsequently, the process etches the irradiated SOG 122 by the buffered fluoric acid to form the patterns 12A as shown in FIG. 6C. Since the irradiation of the electron beams is carried out as varying the condition thereof, the penetration depth of the beams into the SOG film 122 and the spreading width of the beams within the SOG film 122 show variety, which results in the etched patterns 12A with various depths, duty ratios, pitches and so on. Thus, the mold 12 is completed with the patterns 12A on the base 12B.

According to the method described above to form the mold 12, the patterns 12A in the mold 12 varies the depth, the duty ratio, the pitch and so on depending on the acceleration voltage and the exposure doses of the electron beams, or the scanning patterns. Such a mold 12 may vary the characteristic of the diffraction grating to be formed by using the mold 12 within the semiconductor wafer.

(Method to Form Diffraction Grating)

Next, a method to form the diffraction grating according to an embodiment of the invention will be described. FIGS. 7A to 8C schematically illustrate the process to form the grating.

First, the mold is prepared by at least one of the first to third method aforementioned. The explanation explained below assumes, for convenience's sake, that the mold 10 is formed by the first method and provides the patterns 10A. The patterns 10A, as already explained, have various depths, duty ratios, and the pitches depending on the position.

Figure 7A:
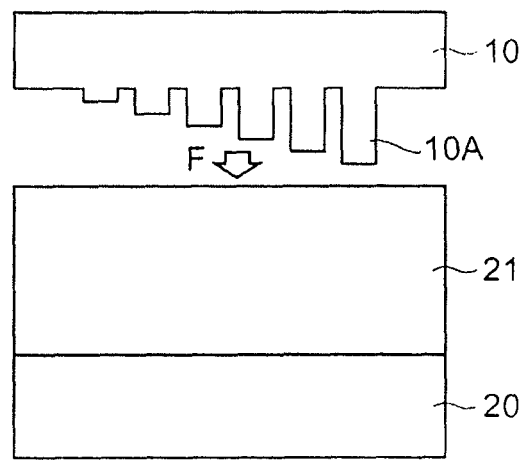
FIGS. 7A to 7C schematically illustrate a process to form the diffraction grating using the mold formed by any one of first to third processes.
Figure 7B:
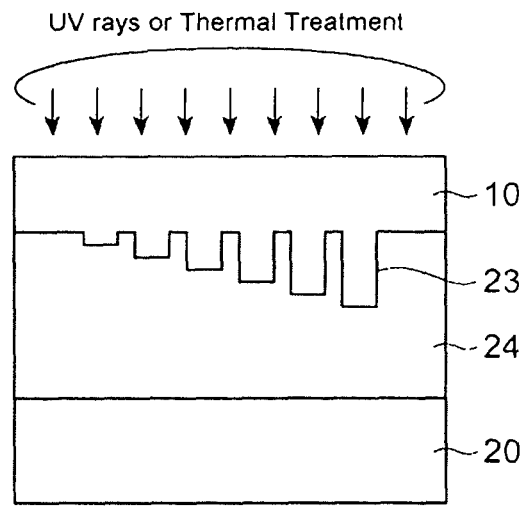

Second, the nanoimprint technique is carried out. That is, the mold 10 with the pattern 10A is pressed against the resist 21 on the semiconductor substrate 20 by the force F whose magnitude may be estimated beforehand depending on the process conditions (FIG. 7A). The substrate 20 may include semiconductor epitaxial layers of the multiple quantum well (MQW) active layer and the cladding layers.

Next, the resist 21 on the substrate 20 may be cured as the mold 21 is pressed thereat, which forms the pattern 23 for the diffraction grating in the cured resist 24. Various techniques may be applicable to cure the resist 24, for instance, the ultra-violet (UV) curing, which is often called as the optical nanoimprint technique, or the thermal curing using the heat treatment, which is often called as the thermal nanoimprint technique. In the optical nanoimprint technique, the mold 10 is preferably made of material with a high transmissivity for the ultraviolet rays, while, the resist 21 is preferably a type of the UV-curable resist.

On the other hand, the thermal nanoimprint technique cures the resist 21, which is once softened by raising the temperature thereof, by cooing it down. Thus, the mold 10 is preferably made of metal, typically nickel (Ni), while, the resist 21 is preferably made of thermoplastic material with a glass transition temperature.

Figure 7C:
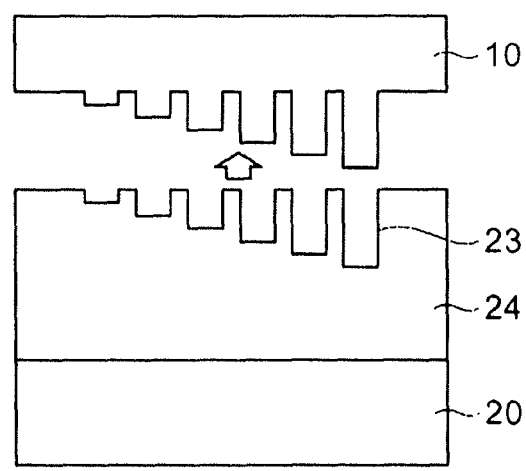

Next, as illustrated in FIG. 7C, the process exfoliates the mold 10 from the resist 24 with the patterns for the grating. As already explained, the resist 24 has grooves with various depths dependent on positions thereof.

Figure 8A:
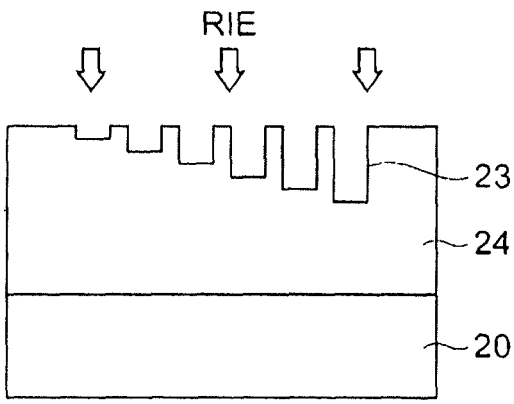
FIGS. 8A to 8C schematically illustrate a process to form the diffraction grating performed subsequent to FIG. 7C.
Figure 8B:
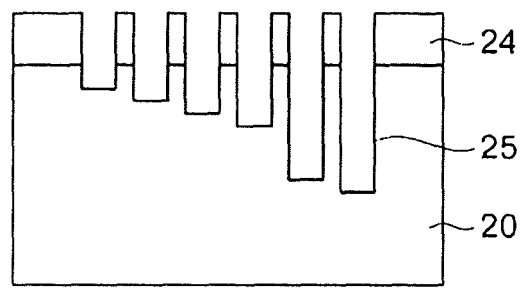
Figure 8C:
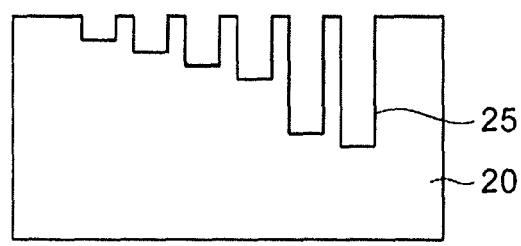

FIG. 8A illustrates the process to etch the semiconductor substrate 20 by the resist 24 with the patterns 23 as the etching mask. The etching may be the reactive ion etching (RIE) whose conditions are so selected that both the resist 24 and the substrate 20 are etched.

Advancing the etching, the semiconductor substrate 20 in a portion where the resist pattern 23 has a deeper groove is going to be exposed, and the substrate 20 exposed in the bottom of the groove is etched in a order that the resist pattern 23 has the deeper groove by the further etching. Finally, the process forms the diffraction grating 25 on the substrate 20, where the grating 25 has grooves with various depths depending on the resist pattern 23. That is, when the mold 10 provides the plural regions shown in FIG. 3 and each region shows patterns specific to respective regions, for instance, the pattern in the region provides an aspect ratio specific to the region, the aspect ratio in the groove on the substrate 20 reflects that of the resist pattern 23 and the mold 10 in respective regions. However, depending on the etching rate of the resist 24 and that of the substrate 20, which is often called as the selection ratio of the etching, the relative aspect ratio in respective regions may be reflected in the pattern on the substrate 20 but the absolute value thereof are different from each other. In other words, when the aspect ratios of the resist are 1.0 to 2.5 with 0.5 steps for the regions A to D, respectively, the aspect ratios of the grooves on the substrate 20 may be 0.5 to 1.25 with 0.25 steps for the regions A to D, respectively. That is, the aspect ratio of the grating 25 finally formed on the substrate 20 may be optionally varied by setting the selection ratio of the etching. Finally, removing the resist 24 after completing the etching, the diffraction grating 25 may be completed.

According to the process to form the diffraction grating 25 above described, the process applies the nanoimprint technique by using the mold 10 with the pattern 10A, where the dimensions such as the depth of the pattern varies therein. Accordingly, the resultant diffraction grating 25 may vary the dimensions such as the depth of the groove. The description above concentrates the subject to be varied on the depth of the groove, but the process may vary the ocher physical parameters such as the duty ratio, the pitch, and so on.

The process thus described may be applicable to a case when various types of diffraction gratings are necessary. The process may also be applicable to enhance the homogeneity of the dimensions of a diffraction grating within a wafer. That is, evaluating the inhomogeneity of the etching rate within the wafer in advance, and forming mold 10 whose patterns, in particular, the depth, the duty ratio, the pitch of the groove and so on, are formed so as to compensate the inhomogeneity of the etching, the resultant diffraction grating realizes improved homogeneity. As an example, when the etching rate shows a concentric circular distribution such that the rate in a peripheral portion of the wafer is about 10% higher than that of the center portion, the homogeneous diffraction grating 25 may be obtained through the nanoimprint technique using the mold 10 with the grooves in the peripheral portion of the wafer about 10% shallower than those in the center portion.

Moreover, the present method mentioned above is also applicable in a case where one diffraction grating built in the device, for instance, in the single distributed feedback (DFB) laser, has variety of dimensions. This enables to modify the optical coupling coefficient between the active layer and the diffraction grating within the device; accordingly, the optical power distribution along the optical axis of the device becomes controllable such that the homogeneous distribution of the optical power is attained; accordingly, the device may suppress the hole-burning effect along its optical axis.

(Process to Form DFB-LD)

Figure 9A:
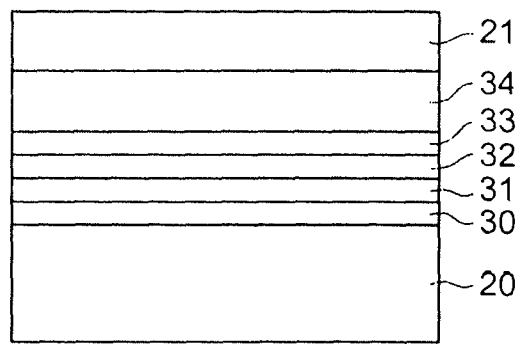
FIGS. 9A to 9C schematically illustrate a process to form the DFB-LD that provides the diffraction grating formed by the process illustrated in FIGS. 7A to 8C.
Figure 9B:
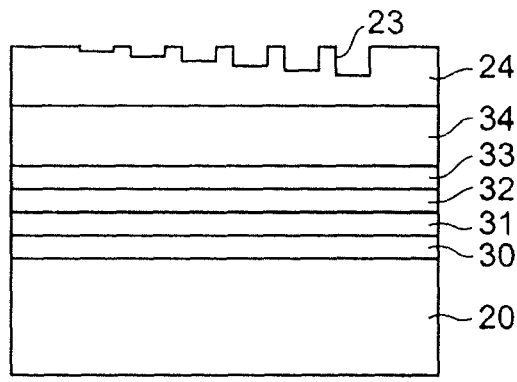
Figure 9C:
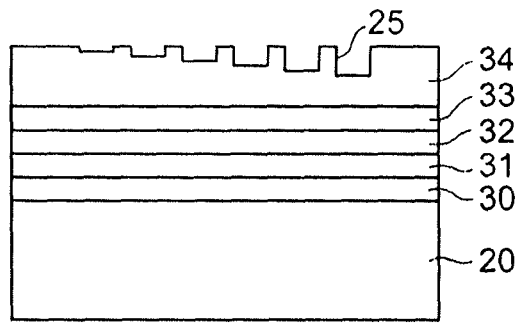
Figure 10:
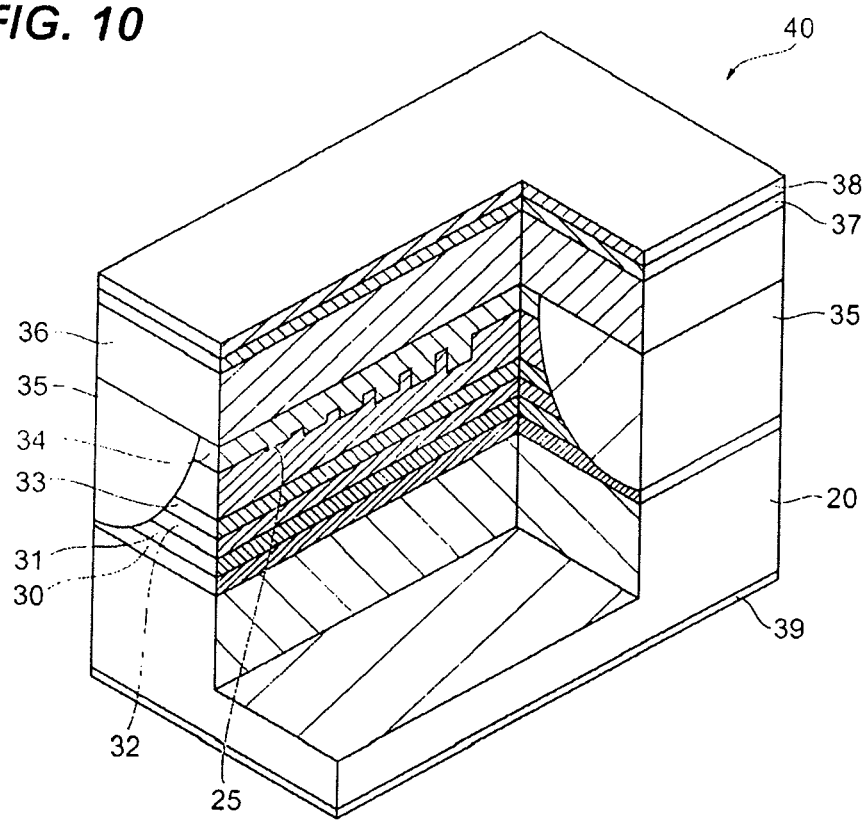
FIG. 10 is a perspective view, a portion of which is broken to indicate the layer stacking, of the DFB-LD formed by the process shown in FIGS. 9A to 9C.

Next, a process to form the DFB-LD according to one embodiment of the present invention will be described. FIGS. 9A to 9C illustrate, in cross sections of the device, the process to form the DFB-LD 40, while, FIG. 10 is a perspective view of the DFB-LD, a portion of which is broken to show the layer structure thereof, obtained through the process of the embodiment.

First, the process forms, on the semiconductor substrate 20, a first cladding layer 30, a first separate optical confinement (SCH) layer 31, an active layer 32, a second SCH layer 33, a layer 34, and a resist 21 in this order. Here, both SCH layers, 31 and 33, may be saved. Second, the mold 10 with the pattern 10A is pressed against the resist 21 to transfer the pattern 10A on the cured resist 24 (FIG. 9B). Etching the cured resist 24 and the layer 34 according to the method described in FIGS. 8A to 8C, and removing the resist 24 after the etching, the diffraction grating shown in FIG. 9C may be obtained in the layer 34, which is often called as the guiding layer.

Next, on the guiding layer 34 formed with the diffraction grating 25 is grown with a second cladding layer with a refractive index different from that of the guiding layer so as to bury the diffraction grating 25. Subsequently, the second cladding layer, the guiding layer 34, the second SCH layer 33, the active layer 32, the first SCH layer and the first cladding layer 30 are wet-etched to form the mesa. Further, the process buries thus formed mesa by the burying layer 35, and on the second cladding layer and the burying layer 35 are grown with the third cladding layer 36. This third cladding layer 36 may be saved. On the third cladding layer 36, or on the second cladding layer and the burying layer 35, is grown with the contact layer 37, and on the contact layer 37 is formed with the upper electrode 38, while, the whole back surface of the substrate 20 is formed with the lower electrode 39. Thus, the DFB-LD 40 is completed.

The process to form the DFB-LD above described adopts the nanoimprint technique using the mold 10 with the pattern whose dimensions such as the pattern depth are non-uniform; accordingly, the resultant diffraction grating may reflect this distributed dimensions. Because the process of the invention may form the diffraction gratings with various dimensions in a wafer, various DFB-LD s 40 with different types of the diffraction gratings may be intermingled within the wafer, which shows a great advantage for the multi-objective but low production.

When the etching to form the diffraction grating shows an inhomogeneous rate within the wafer, the process may compensate the inhomogeneous rate by using the mold with the imprint pattern 10A whose dimensions are varied. In this case, because the depth of the groove in the diffraction grating may be homogeneous, the DFB-LD with this diffraction grating may also enhance its homogeneity.

Moreover, using the mold 10 with the imprint pattern 10A with a non-uniform dimensions, the DFB-LD with the non-uniform diffraction grating may be obtained. In this case, the optical coupling coefficient between the diffraction grating and the active layer varies within the device, the optical power distribution along the optical axis may be modified, which effectively suppresses the hole-burning effect.

What is claimed is:

1. A method for forming a diffraction grating, comprising steps of:

forming a plurality of semiconductor layers on a semiconductor substrate;

evaluating inhomogeneity in an etching rate of said semiconductor layers, said etching rate showing a distribution within said semiconductor layers, preparing a mold that includes a particular pattern reflecting a diffraction grating having an aspect ratio, a duty ratio and a pitch, said mold including a plurality of regions each having one said aspect ratio specific to said region and different from other regions, wherein said aspect ratios in said regions have a distribution that compensates said distribution of said etching rate in said semiconductor layers;

coating a resist on said semiconductor layers;

printing said particular pattern of said mold on said resist to form a resist pattern by pressing said pattern of said mold on said resist and hardening said resist while keeping said mold pressed on said resist; and etching said semiconductor layers to reflect said particular pattern of said mold on said semiconductor layers by using said resist pattern as an etching mask.

2. The method of claim 1, wherein said step of preparing said mold includes steps of, coating another resist for electron beam lithography on a silicon substrate, irradiating said another resist by electron beams while varying an acceleration voltage for said electron beams in respective regions, developing said another resist, and etching said silicon substrate.

\* \* \* \* \*